(12) United States Patent
deVilliers

(10) Patent No.: US 9,818,611 B2
(45) Date of Patent: Nov. 14, 2017

(54) METHODS OF FORMING ETCH MASKS FOR SUB-RESOLUTION SUBSTRATE PATTERNING

(71) Applicant: Tokyo Electron Limited, Minato-ku, Tokyo (JP)

(72) Inventor: Anton J. deVilliers, Clifton Park, NY (US)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 15/270,717

(22) Filed: Sep. 20, 2016

(65) Prior Publication Data

US 2017/0092496 A1    Mar. 30, 2017

Related U.S. Application Data

(60) Provisional application No. 62/258,119, filed on Nov. 20, 2015, provisional application No. 62/232,005, filed on Sep. 24, 2015.

(51) Int. Cl.
| | |
|---|---|
| *H01L 29/06* | (2006.01) |
| *H01L 21/033* | (2006.01) |
| *H01L 21/308* | (2006.01) |
| *H01L 21/311* | (2006.01) |

(52) U.S. Cl.
CPC ...... *H01L 21/0337* (2013.01); *H01L 21/3081* (2013.01); *H01L 21/3086* (2013.01); *H01L 21/31144* (2013.01)

(58) Field of Classification Search
CPC ............ H01L 21/0337; H01L 21/3086; H01L 21/31144
USPC ........................................................ 257/618
See application file for complete search history.

(56) References Cited

U.S. PATENT DOCUMENTS

2007/0099431 A1* 5/2007 Li ...................... H01L 21/3081
                                                                        438/735
2009/0258492 A1* 10/2009 Sant ................... H01L 21/3086
                                                                        438/692

* cited by examiner

*Primary Examiner* — Tu-Tu Ho

(57) ABSTRACT

Techniques disclosed herein provide a method for pitch reduction (increasing pitch/feature density) for creating high-resolution features and also for cutting on pitch of sub-resolution features. Techniques include using multiple materials having different etch characteristics to selectively etch features and create cuts where specified. A sequence of materials or repeating pattern of lines of materials is used that provides selective self-alignment based on different etch resistivities. Combined with an underlying transfer or memorization layer, multiple different etch selectivities can be accessed. An etch mask defines which regions of the lines of multiple materials can be etched.

19 Claims, 10 Drawing Sheets

METHODS OF FORMING ETCH MASKS FOR SUB-RESOLUTION SUBSTRATE PATTERNING

CROSS REFERENCE TO RELATED APPLICATIONS

The present application claims the benefit of U.S. Provisional Patent Application No. 62/232,005, filed on Sep. 24, 2015, entitled "Methods of Forming Etch Masks for Sub-Resolution Substrate Patterning," which is incorporated herein by reference in its entirety. The present application also claims the benefit of U.S. Provisional Patent Application No. 62/258,119, filed on Nov. 20, 2015, entitled "Methods of Forming Etch Masks for Sub-Resolution Substrate Patterning," which is incorporated herein by reference in its entirety.

BACKGROUND OF THE INVENTION

This disclosure relates to substrate processing, and, more particularly, to techniques for patterning substrates including patterning semiconductor wafers.

Methods of shrinking line-widths in lithographic processes have historically involved using greater-NA optics (numerical aperture), shorter exposure wavelengths, or interfacial media other than air (e.g., water immersion). As the resolution of conventional lithographic processes has approached theoretical limits, manufacturers have started to turn to double-patterning (DP) methods to overcome optical limitations.

In material processing methodologies (such as photolithography), creating patterned layers comprises the application of a thin layer of radiation-sensitive material, such as photoresist, to an upper surface of a substrate. This radiation-sensitive material is transformed into a relief pattern which can be used as an etch mask to transfer a pattern into an underlying layer on a substrate. Patterning of the radiation-sensitive material generally involves exposure to actinic radiation through a reticle (and associated optics) onto the radiation-sensitive material using, for example, a photo-lithography system. This exposure can then be followed by the removal of irradiated regions of the radiation-sensitive material (as in the case of positive photoresist), or non-irradiated regions (as in the case of negative resist) using a developing solvent. This mask layer can comprise multiple sub-layers.

Conventional lithographic techniques for exposing a pattern of radiation or light onto a substrate have various challenges that limit a size of features exposed, and limit pitch or spacing between exposed features. One conventional technique to mitigate exposure limitations is that of using a double patterning approach to allow the patterning of smaller features at a smaller pitch than what is currently possible with conventional lithographic techniques.

SUMMARY

Semiconductor technologies are continually progressing to smaller feature sizes or nodes including feature sizes of 14 nanometers, 7 nm, 5 nm, and below. This continual reduction in sizes of features from which various elements are fabricated places ever-greater demands on techniques used to form the features. The concept of "pitch" can be used to describe the sizing of these features. Pitch is the distance between two identical points in two adjacent repetitive features. Half-pitch then is half the distance between identical features of adjacent features.

Pitch reduction techniques are termed (often somewhat erroneously yet routinely) "pitch multiplication" as exemplified by "pitch doubling" et cetera. Pitch reduction techniques can extend the capabilities of photolithography beyond feature size limitations (optical resolution limitations). That is, conventional multiplication of pitch (more accurately pitch reduction, or multiplication of pitch density) by a certain factor involves reducing a target pitch by a specified factor. Double patterning techniques used with 193 nm immersion lithography are conventionally considered as one of the most promising techniques to pattern 22 nm nodes and smaller. Noteworthy is that self-aligned spacer double patterning (SADP), or self-aligned quadruple patterning (SAQP), has already been established as a pitch density doubling process and has been adapted in high volume manufacturing of NAND flash memory devices. Moreover, ultra-fine resolution can be obtained to repeat the SADP step twice as pitch quadrupling.

Although there exist several patterning techniques to increase pattern density or pitch density, conventional patterning techniques suffer from poor resolution or rough surfaces of etched features. Thus, conventional techniques cannot provide a level of uniformity and fidelity desired for very small dimensions (20 nm and smaller). Reliable lithographic techniques can produce features having a pitch of about 80 nm. Conventional and emerging design specifications, however, desire to fabricate features having critical dimensions less than about 20 nm or 10 nm. Moreover, with pitch density doubling and quadrupling techniques, sub-resolution lines can be created, but making cuts or connections between these lines is challenging, especially since the pitch and dimensions needed for such cuts is far below capabilities of conventional photo-lithography systems.

Techniques disclosed herein provide a method for pitch reduction (increasing pitch/feature density) for creating high-resolution features and also for cutting on pitch of sub-resolution features. Techniques include using multiple materials having different etch characteristics to selectively etch features and create cuts where specified. Thus, methods herein provide a sequence of materials that provide selective self-alignment. Combined with an underlying transfer or memorization layer, five different etch selectivities can be accessed.

One embodiment includes a method of patterning a substrate. The method includes providing a substrate having mandrels positioned on an underlying layer, with the mandrels comprised of a first material. First sidewall spacers are formed on exposed sidewalls of the mandrels, with the first sidewall spacers comprised of a second material. Second sidewall spacers are formed on exposed (uncovered) sidewalls of the first sidewall spacers, with the second sidewall spacers comprised of a third material. Fill structures are formed that fill open spaces defined between exposed sidewalls of second sidewall spacers that face each other, with the fill structures comprised of a fourth material. Top surfaces of the mandrels, the first sidewall spacers, the second sidewall spacers, and the fill structures are all uncovered. The first material, the second material, the third material and the fourth material are all chemically different from each other in that one or more of the materials can be selectively etched with respect to remaining materials.

Of course, the order of discussion of the different steps as described herein has been presented for clarity sake. In general, these steps can be performed in any suitable order. Additionally, although each of the different features, techniques, configurations, etc. herein may be discussed in different places of this disclosure, it is intended that each of the concepts can be executed independently of each other or in combination with each other. Accordingly, the present invention can be embodied and viewed in many different ways.

Note that this summary section does not specify every embodiment and/or incrementally novel aspect of the present disclosure or claimed invention. Instead, this summary only provides a preliminary discussion of different embodiments and corresponding points of novelty over conventional techniques. For additional details and/or possible perspectives of the invention and embodiments, the reader is directed to the Detailed Description section and corresponding figures of the present disclosure as further discussed below.

BRIEF DESCRIPTION OF THE DRAWINGS

A more complete appreciation of various embodiments of the invention and many of the attendant advantages thereof will become readily apparent with reference to the following detailed description considered in conjunction with the accompanying drawings. The drawings are not necessarily to scale, with emphasis instead being placed upon illustrating the features, principles and concepts.

DETAILED DESCRIPTION

Techniques disclosed herein, provide a method and fabrication structure for pitch reduction (increasing pitch/feature density) for creating high-resolution features and also for cutting on pitch of sub-resolution features. Techniques include using multiple materials having different etch characteristics to selectively etch features and create cuts or blocks where specified. This can include creating a repeating pattern of materials having a pattern of A-B-C-D-C-B-A, with half pitches below 40 nanometers and even below 12 nanometers and smaller. Critical dimensions of materials can be controlled by type of deposition thickness, such as with atomic layer deposition, instead of being controlled just by optical resolution.

Figure 1:
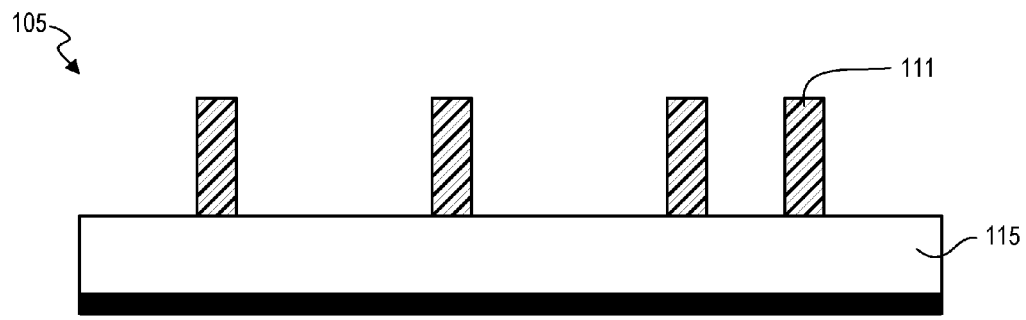
FIGS. 1-7 are cross-sectional side views of an example substrate segment according to embodiments disclosed herein.

One embodiment includes a method of patterning a substrate. Such a method is useful for microfabrication of semiconductor devices and integrated circuits. Referring now to FIG. 1, the method includes providing a substrate 105 having mandrels 111 positioned on an underlying layer 115. The mandrels 111 are comprised of a first material. The substrate 105 can include a silicon wafer. One or more additional underlying layers and/or buried structures can be included depending on a substrate's progress within a given fabrication flow. There are many different materials from which the mandrels can be constructed. Materials can include various nitrides, oxides, organics, metals, as well as other conventionally available materials. Mandrels 111 can be formed using conventional patterning techniques. For example, mandrels 111 can be a result of self-aligned double patterning or self-aligned quadruple patterning techniques and thus can have sub-resolution half pitches.

Figure 2:
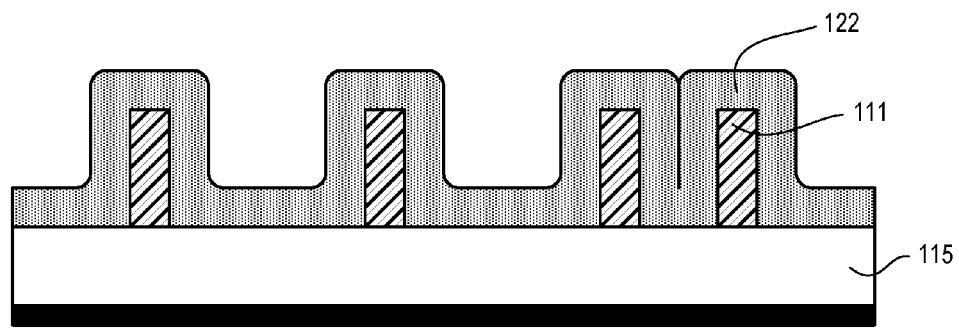
Figure 3:
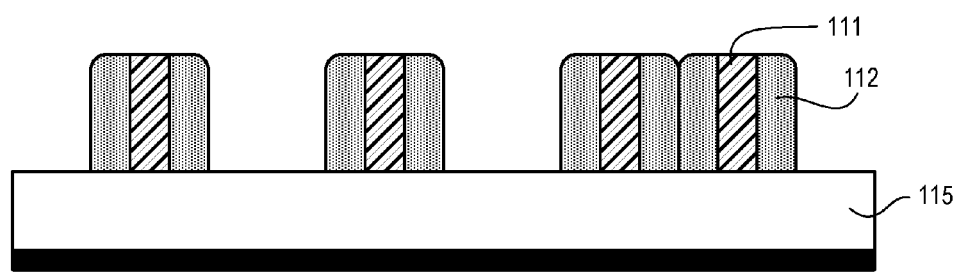

First sidewall spacers 112 are formed on exposed sidewalls of the mandrels 111 as shown in FIG. 3. First sidewall spacers 112 are comprised of a second material. Note that FIG. 3 shows spacers formed on vertical sidewalls of the mandrels 111. Forming the first sidewall spacers 112 can include conformally depositing the second material on the substrate. FIG. 2 shows a conformal film 122 having been deposited on the substrate 105. Such spacer formation is conventionally known. For example, highly conformal deposition techniques, such as atomic layer deposition (ALD), can be selected for depositing spacer material, which approximately uniformly covers the mandrels 111 and underlying layer 115. A spacer open etch can then be executed to complete formation of sidewall spacers. Such a spacer open etch is typically a directional etch that removes the second material from a top surface of the mandrels 111 and from the underlying layer 115 in between second material deposited on sidewalls of the mandrels 111 (except where material on sidewalls of mandrels covers the underlying layer 115).

Figure 4:
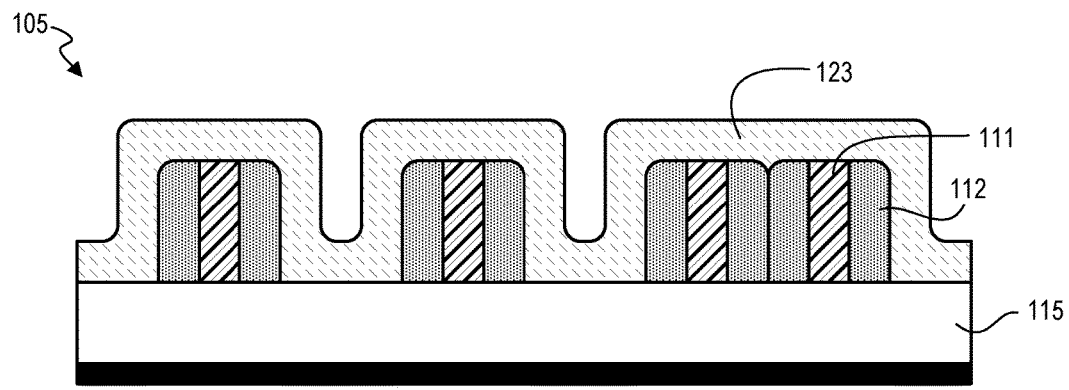
Figure 5:
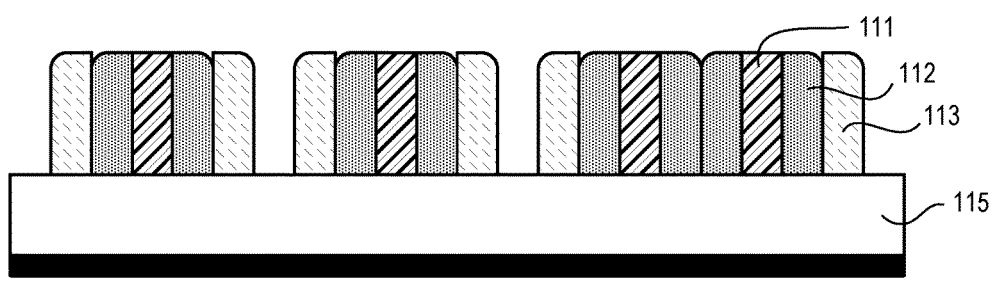

Second sidewall spacers 113 are formed on exposed sidewalls of the first sidewall spacers 112 as shown in FIG. 5. The second sidewall spacers 113 are comprised of a third material. Note that FIG. 5 shows spacers formed on vertical sidewalls of the first sidewall spacers 112. Forming the second sidewall spacers 113 can include conformally depositing the third material on the substrate. FIG. 4 shows a conformal film 123 having been deposited on the substrate 105. Such spacer formation is conventionally known. For example, highly conformal deposition techniques, such as atomic layer deposition (ALD), can be selected for depositing spacer material, which approximately uniformly covers existing structures on the substrate, which can include mandrels 111, first sidewall spacers 112, and underlying layer 115. A spacer open etch can then be executed to complete formation of sidewall spacers. Such a spacer open etch is typically a directional etch that removes the third material from a top surface of the mandrels 111, the first sidewall spacers 112, and from the underlying layer 115 in between third material deposited on sidewalls of the first sidewall spacers 112 (except where material on vertical sidewalls of structures covers the underlying layer 115). At least a portion of the first sidewall spacers 112 define open space between each other prior to forming second sidewall spacers. In some locations, mandrel half-pitch can be shortened such that forming first sidewall spacers completely fills space between selected mandrel pairs and thus prevents forming second sidewall spacers in such a location. In other words, varying pitch of the mandrels can cause some merged spacers, either from the first sidewall spacers or the second sidewall spacers. Such a fabrication technique can be beneficial, for example, in forming power rails for integrated circuits.

Figure 6:
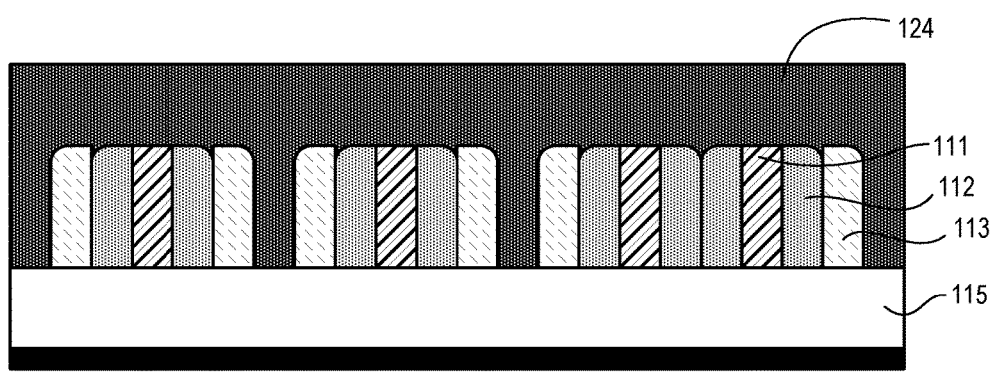
Figure 7:
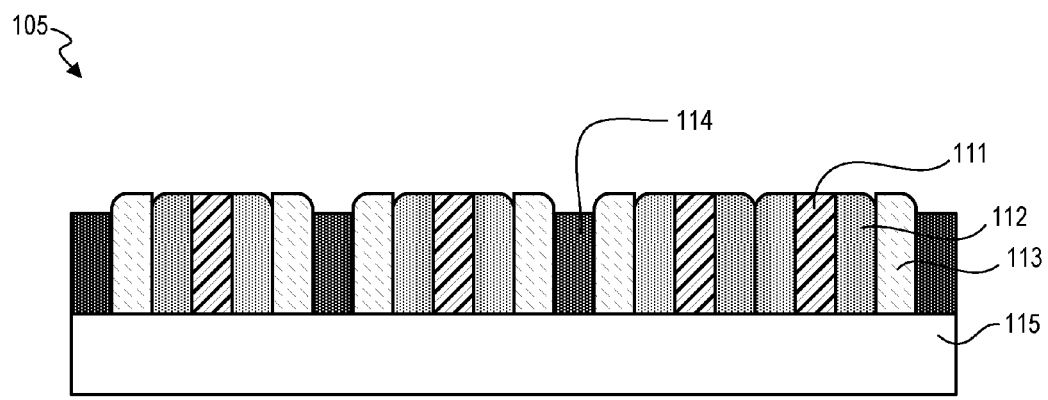

Referring now to FIG. 7, fill structures 114 are then formed on the substrate 105. Fill structures 114 fill open spaces defined between exposed sidewalls of second sidewall spacers 113 that face each other (prior to forming the fill structures 114). The fill structures 114 are comprised of a fourth material. Fill structures 114 are formed such that top surfaces of the mandrels 111, the first sidewall spacers 112, the second sidewall spacers 113, and the fill structures 114 are all uncovered. Material selection during formation is such that the first material, the second material, the third material and the fourth material are all chemically different from each other. Forming the fill structures 114 can include depositing an overburden material 124 of the fourth material on the substrate. FIG. 6 shows overburden material 124 deposited on substrate 105, which can entirely cover existing structures. Various deposition techniques for depositing the overburden material 124 can be used including spin-on deposition. After deposition, overburden material 124 can be etched back until the fourth material is recessed below top surfaces of the second sidewall spacers 113. The fourth material would also be recessed below top surfaces of first sidewall spacers 112 and mandrels 111.

Figure 8:
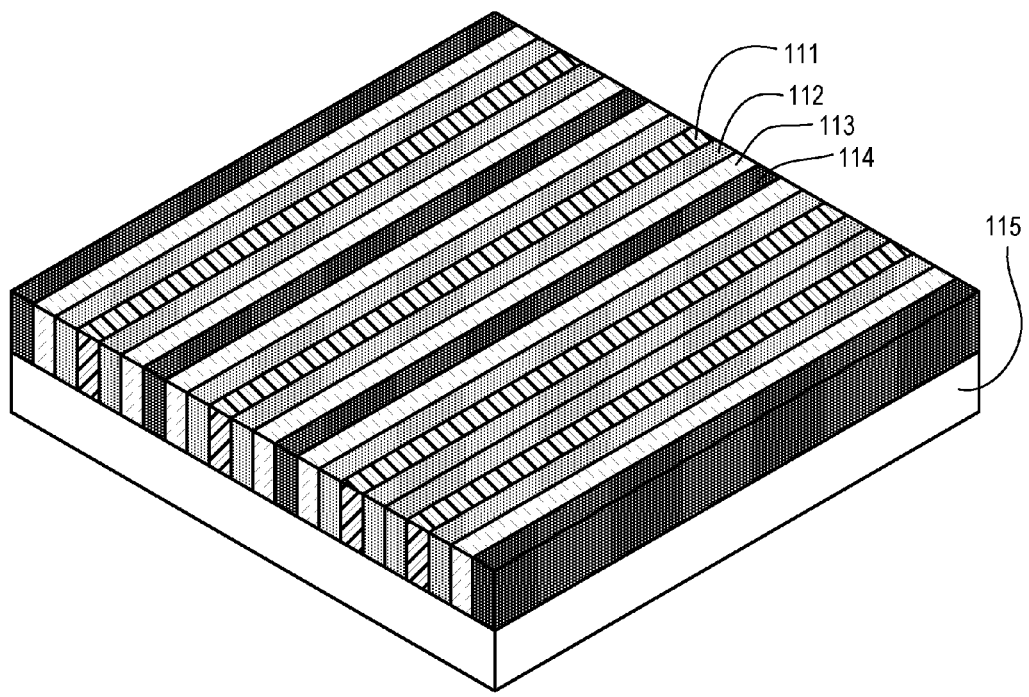
FIG. 8 is a cross-sectional perspective view of an example substrate segment according to embodiments disclosed herein.

FIG. 8 shows a perspective view of a substrate segment having four different line arrays from the mandrels 111, first sidewall spacers 112, second sidewall spacers 113, and fill structures 114. In this result, the first material, the second material, the third material and the fourth material are all chemically different from each other in that a first etch chemistry selectively etches the first material with respect to remaining materials, a second etch chemistry selectively etches the second material with respect to remaining materials, a third etch chemistry selectively etches the third material with respect to remaining materials, and a fourth etch chemistry selectively etches the fourth material with respect to remaining materials. In other words, any of the four different materials can be etched selective to remaining materials. In other embodiments, the first material, the second material, the third material and the fourth material are all chemically different from each other in that when etching using a predetermined etch chemistry a given two materials are selectively etched with respect to remaining materials. In another embodiment, the first material, the second material, the third material and the fourth material are all chemically different from each other in that etching the substrate using a predetermined etch chemistry selectively etches a given three materials with respect to remaining materials. In another embodiment, at least two materials of the first material, the second material, the third material and the fourth material are chemically different from remaining materials. Thus, an etching process can be executed using a predetermined etch chemistry that etches one or more selected materials with respect to remaining materials.

In other embodiments, two of the first material, the second material, the third material and the fourth material are a same material in that a first etch chemistry simultaneously and selectively etches two of the first material, the second material, the third material and the fourth material with respect to remaining materials. Thus, instead of having all different materials, two or more materials are a same material and thus inherently have matching etch characteristics. Certain differing materials can etch similarly with particular chemistries that are compatible with etching both, and thus there are different methods to create features that can be etched simultaneously. Materials of a same material can be, for example, adjacent lines or alternating lines on a given substrate.

Figure 9:
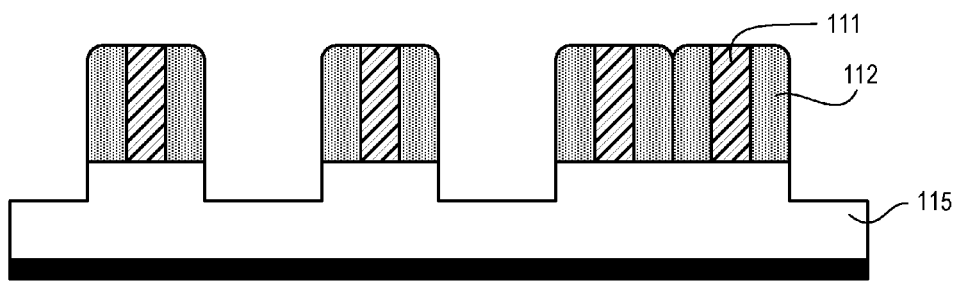
FIGS. 9-13 are cross-sectional side views of an example substrate segment according to embodiments disclosed herein.
Figure 10:
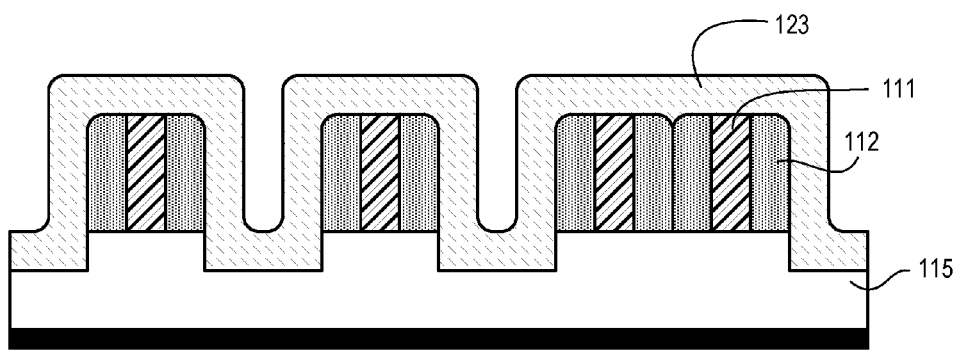
Figure 11:
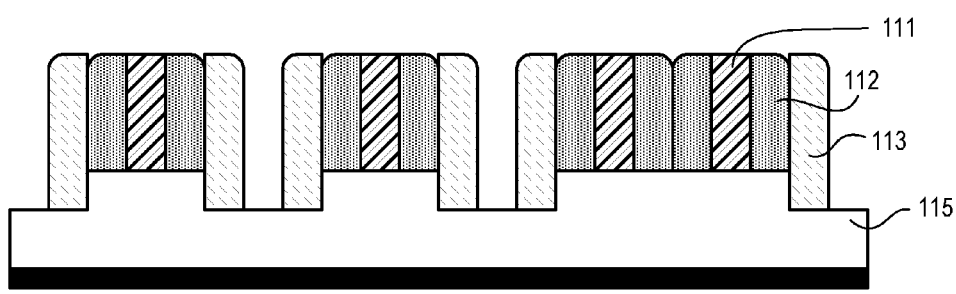
Figure 12:
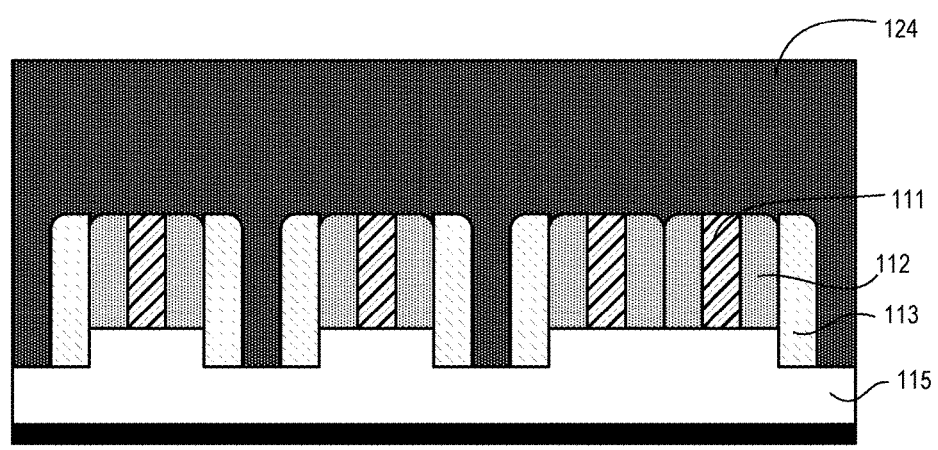
Figure 13:
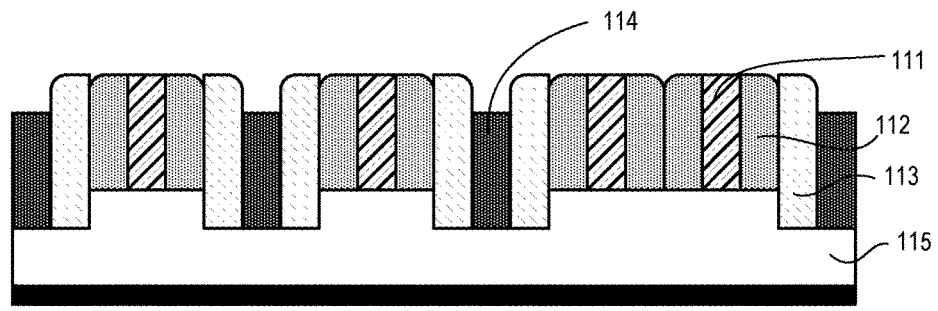

Referring now to FIGS. 9-13, an alternative method is disclosed that can be beneficial in recessing the overburden material 124. This method involves partially etching into underlying layer 115 when forming the first sidewall spacers 112. FIG. 9 is similar to FIG. 3, except that the spacer open etch includes etching partially into the underlying layer 115. Note that a top surface of underlying layer 115, that is exposed to directional etchants, is now below a bottom surface of mandrels 111. A benefit of this recess is more apparent in FIG. 10 as conformal film 123 is deposited on structures with relatively taller sidewalls. FIG. 11 shows second sidewall spacers 113 as taller than first sidewall spacers 112. As such, when overburden material 124 is deposited (FIG. 12), then the amount of overburden material 124 deposited between second sidewall spacers 113 is taller which means more height or tolerance when executing an etch back to form fill structures 114, as shown in FIG. 13.

Various etch chemistries can be used to selectively etch one or more of the four materials. Etch chemistries (process gasses and gas combinations) are known that can selectively etch particular types of materials relative to other types of materials at various selectivity ratios.

The underlying layer 115 can be comprised of a fifth material that is chemically different from the first material, the second material, the third material and the fourth material. With a fifth material different from the other four materials, the underlying layer can be used as a memorization layer or transfer layer for creating composite patterns to transfer into other layers.

Figure 14:
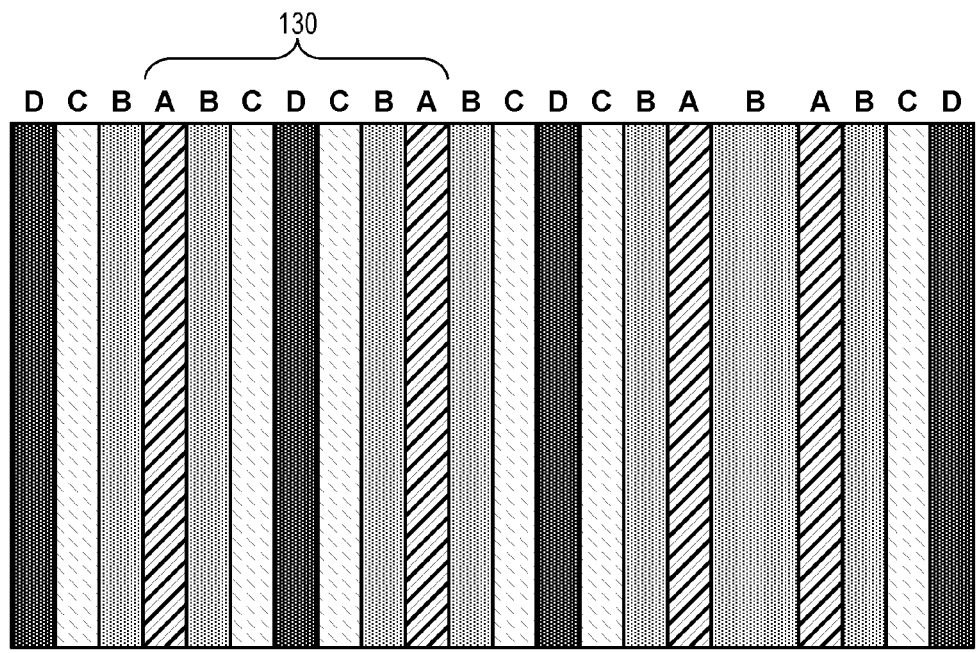
FIGS. 14-21 are a top views of an example substrate segment according to embodiments disclosed herein.

Using masking layers can further assist with pattern transfer. FIG. 14 is a top view of an example substrate segment from FIG. 8. Note that lines of four different materials have been formed for further patterning operations. In general, at least a portion of the substrate can include a repeating pattern of lines in which the material type pattern is A-B-C-D-C-B-A as shown in segment 130. Thus, depending on type of material, various spacing distances are available. For example, between repeating instances of Material A or Material D there are 5 lines of differing materials. These materials can correspond to mandrel material and fill structure material. Between repeating instances of Material B or Material C, there are typically one or three lines of differing material types.

Figure 15:
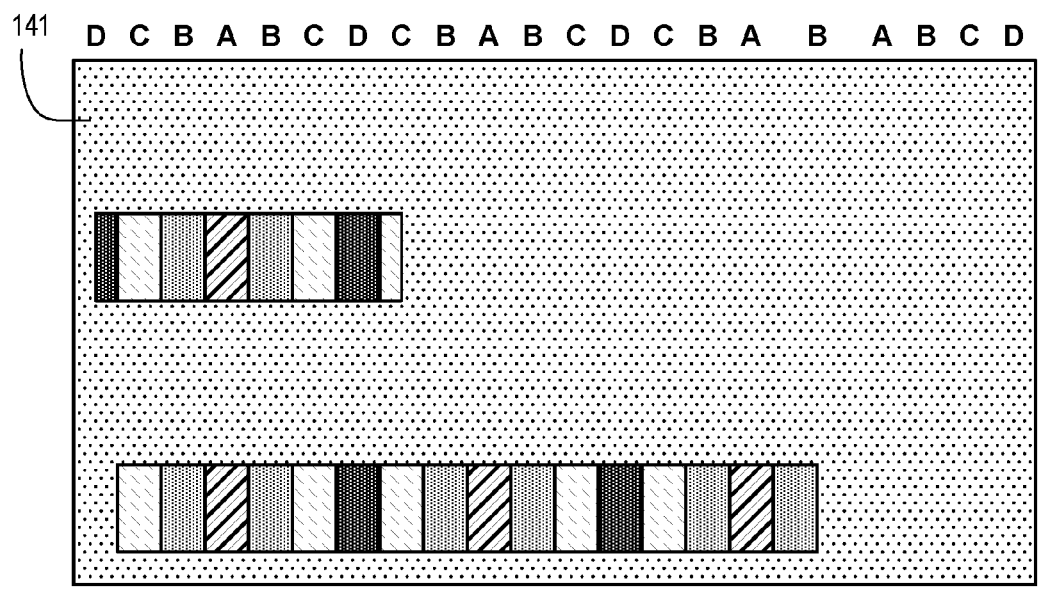

A first etch mask 141 can be provided on the substrate that defines openings that uncover the first material, the second material, the third material and the fourth material, as shown in FIG. 15. Note that such an etch mask can define openings that can be linear with smaller dimensions in one direction. First etch mask 141, and corresponding openings, can be defined by a conventional photolithography system.

Figure 16:
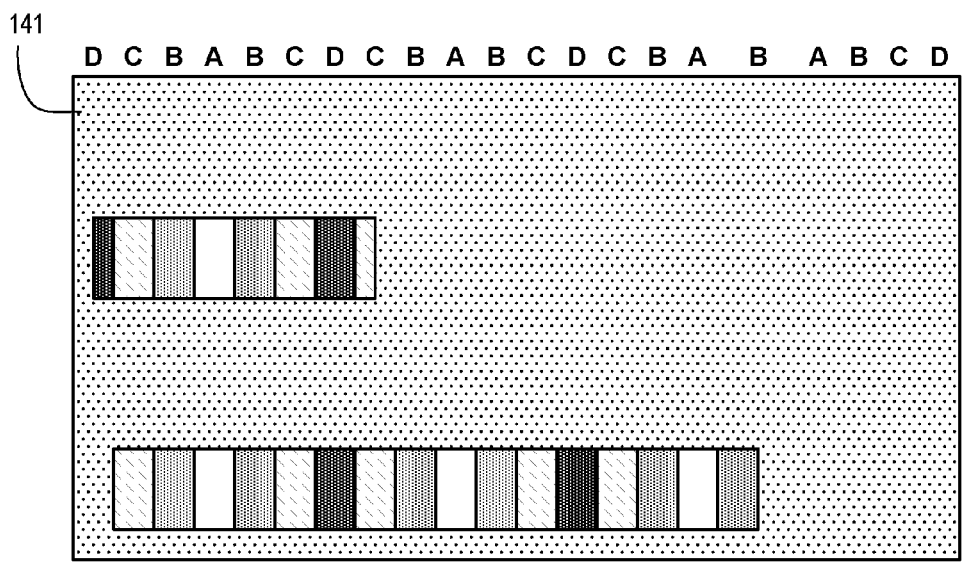
Figure 17:
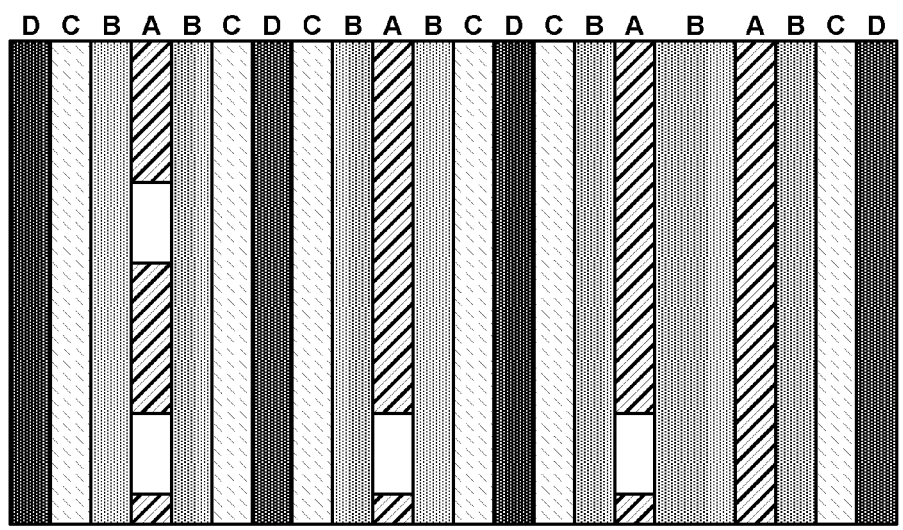

A first-selected material is selectively etched using the first etch mask 141 and a first etch chemistry. FIG. 16 shows an example result of this selective etching. Note that unmasked portions of Material A have been removed and underlying layer 115 is now visible at those locations. Note also that the remaining materials were not removed during this etch step. FIG. 17 illustrates these results with the first etch mask 141 removed. In other embodiments, a second selected material can be selectively etched using the first etch mask and a second chemistry. Alternatively, one or more materials can be selectively etched relative to remaining material or materials.

Figure 18:
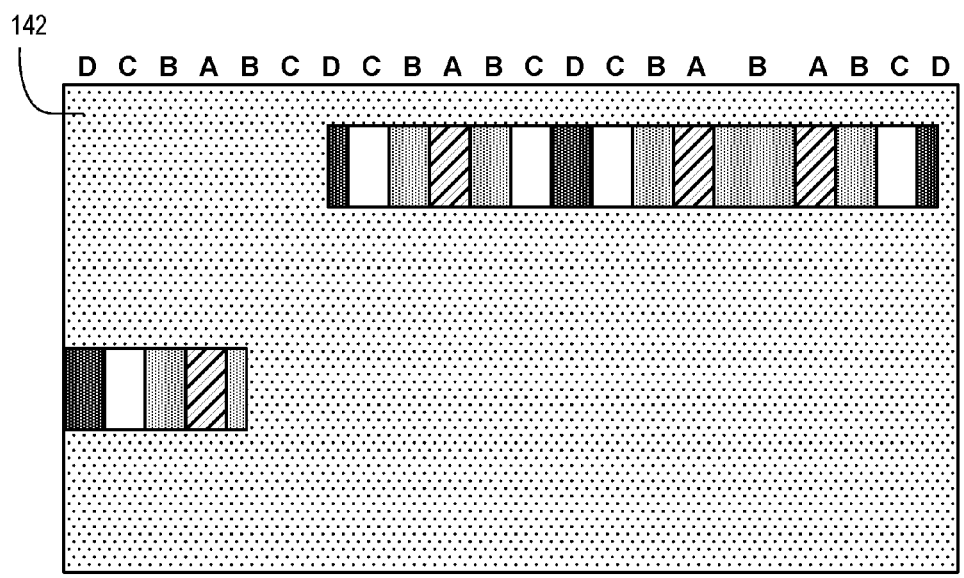
Figure 19:
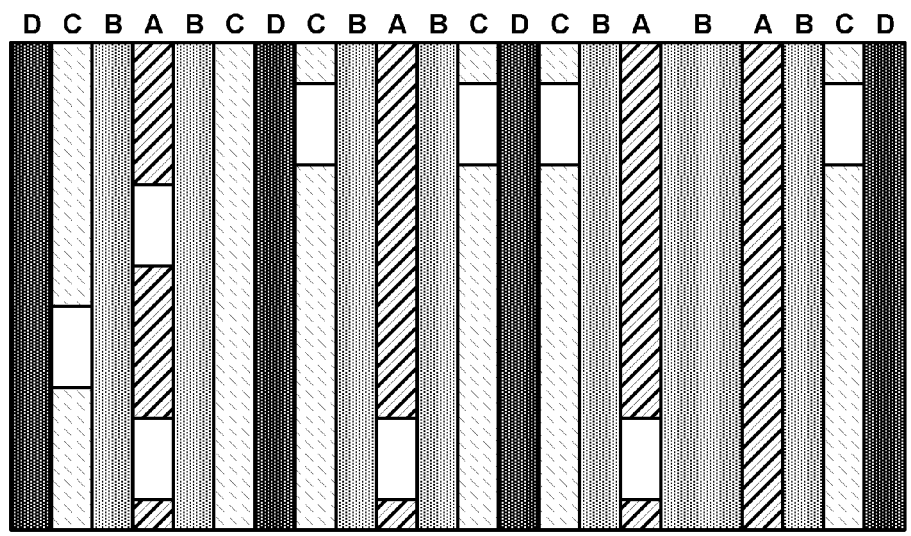
Figure 20:
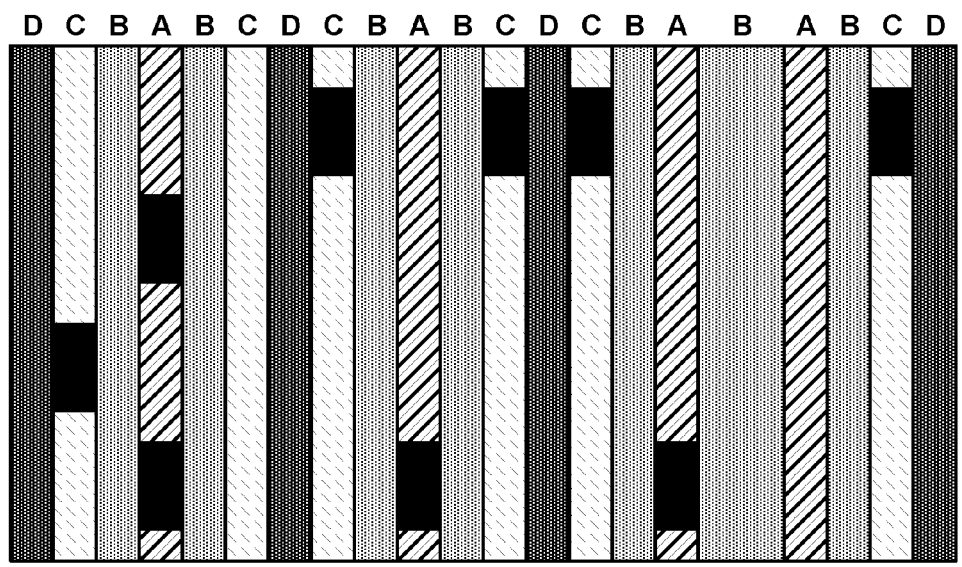

Referring now to FIG. 18, a second etch mask 142 can be created on the substrate that defines openings that uncover the first material, the second material, the third material and the fourth material. One or more unmasked materials can then be selectively etched relative to remaining materials using the second etch mask and a second etch chemistry. FIG. 18 shows unmasked portions of Material C having been etched. FIG. 19 shows the substrate segment with second etch mask 142 removed. FIG. 20 shows results of transferring a composite pattern through the underlying layer. In the non-limiting example shown in FIG. 21, Materials B and D have been kept or reversed to be combined with transferred segments or cuts to provide the structure shown in FIG. 21.

Note that a pitch of the mandrels is less than an optical resolution of a given photolithography system. For example, half-pitch spacing of the mandrels can be less than 40 nanometers, 12 nanometers, or even less, and techniques herein can make cuts between such narrow pitch lines using conventional photo-lithography systems.

Figure 22:
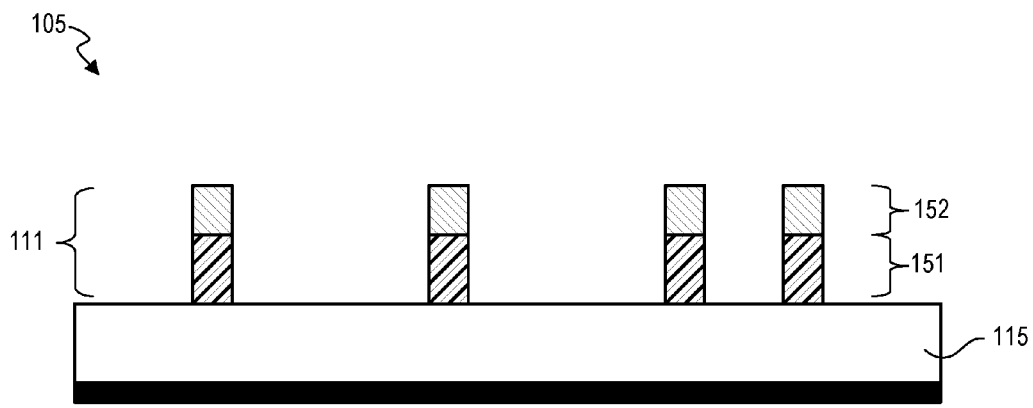
FIGS. 22-24 are cross-sectional side views of an example substrate segment according to embodiments disclosed herein.
Figure 23:
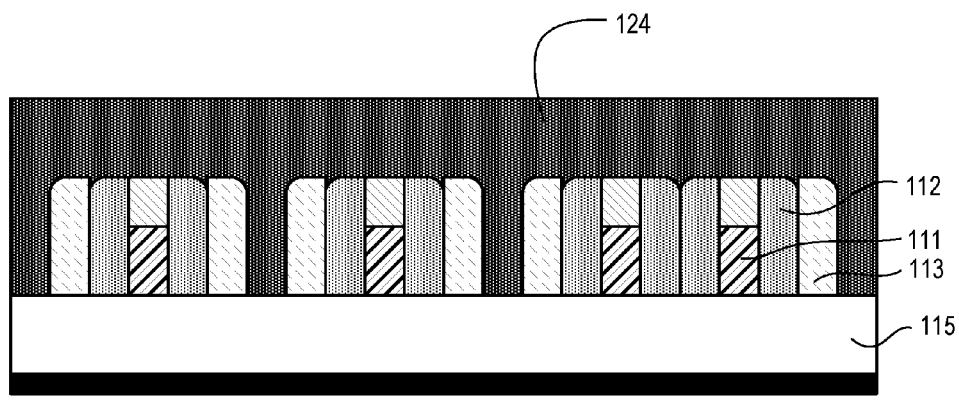
Figure 24:
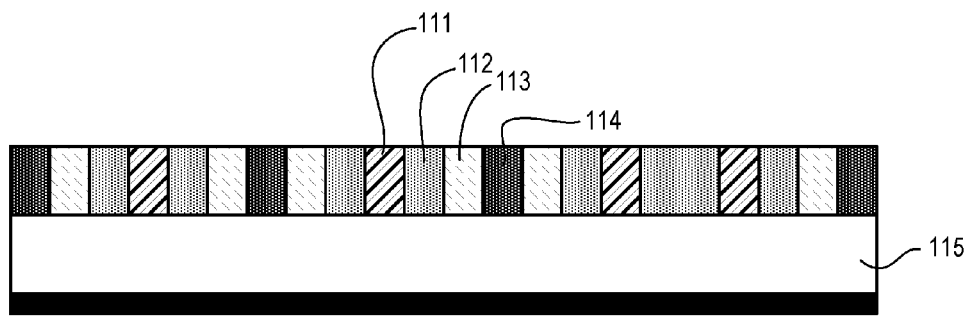

Other methods can be used for applications in which a coplanar surface of the four materials is desired. In such an embodiment, providing the substrate 105 having mandrels 111 positioned on an underlying layer includes the mandrels being comprised of two materials. A lower portion 151 of the mandrels being comprised of the first material, and an upper portion 152 of the mandrels being comprised of a sixth material. An example of this is shown in FIG. 22. The first material is selected as a stop material layer that is resistant to chemical-mechanical polishing, such as a nitride. Process flow then continues as previously described in FIGS. 1-6 to the point at which overburden material 124 is deposited on the substrate 105, as shown in FIG. 23. At this point an etch back can be omitted or partially executed. This embodiment includes a planarizing step that planarizes the substrate by executing a chemical-mechanical polishing process that planarizes the mandrels, the first sidewall spacers, the second sidewall spacers, and the fill structures down to a top surface of the lower portion 151 of the mandrels 111 such that top surfaces of the mandrels, the first sidewall spacers, the second sidewall spacers, and the fill structures are all coplanar, as shown in FIG. 24. One advantage of such a technique is to remove curved, pointed, or angled surfaces of sidewall spacers.

Another embodiment includes a patterned structure on a semiconductor substrate. This patterned structure includes a nanofabricated structure on a substrate having lines of four different materials. The lines of four different materials define a repeating sequence of A-B-C-D-C-B-A in at least a portion of the substrate. A top surface of each line is uncovered and thus can be directionally etched. At least two of the lines have been created as sidewall spacers using conformal deposition followed by directional etching. Lines of respective materials have a half-pitch spacing of less than 16 nanometers. The four different materials are chemically different from each other in that one or more materials can be selectively etched with respect to remaining materials. FIG. 8 is an illustration of an example embodiment of this patterned structure. This patterned structure is typically not a final structure, but an enabling structure for subsequent patterning, cutting on pitch, et cetera.

As can be appreciated, a matrix of selectable materials and material combinations can be created to create features at desired locations and lengths that are below resolution capabilities of conventional photolithography systems. Note that etched features themselves can be transferred into memorization layers and/or target layers, and can also be used to reverse patterns. Accordingly, five different materials can be accessed for selective etching. Self-alignment can be selected at various places on a substrate using an etch mask and the differential etch selectivities of the different materials. In other words, with four different materials of known dimensions, a designer can select where to execute an etch and have that etch be self-aligned at sub-resolution dimensions. For example, if a given contact pattern from a photoresist material is relatively large and spans multiple materials, a contact will only be etched at one of the materials within that contact pattern opening.

Figure 21:

Techniques herein can be used to provide a pedestalized color scheme, that is, materials with differential etch selectivities. Starting with mandrels, which can themselves be products of sub-resolution multiple patterning, the mandrels are double wrapped with spacer (conformal material) and remaining spaces are filled with a fourth material. Cut lengths are then controlled by SADP/SAQP as well as ALD techniques, which can be controlled to significantly smaller dimensions with respect to photolithographic resolutions. For example, SADP/SAQP techniques can reduce optically set resolution patterns to an eighth or sixteenth of a starting size, and the spacer deposition techniques can be controlled by the nanometer or less. Conventionally, it is very difficult to cut on pitch. Conventional photolithography systems can make cuts of about 42 nanometers. With techniques herein, however, a contact can be placed or cut at will anywhere. This patterning technique also enables pitch splitting across colors. In some regions there can be a full half pitch between materials, and other regions there are relatively large amounts of self-alignment, such as between mandrels. Moreover, by selecting two or more of the five color materials in which two of the materials are adjacent to each other, off-pitch or mixed size etches can be executed, as can be seen in FIG. 21. Thus, various pitch multiples can be made as a cut or a block with techniques herein.

In the preceding description, specific details have been set forth, such as a particular geometry of a processing system and descriptions of various components and processes used therein. It should be understood, however, that techniques herein may be practiced in other embodiments that depart from these specific details, and that such details are for purposes of explanation and not limitation. Embodiments disclosed herein have been described with reference to the accompanying drawings. Similarly, for purposes of explanation, specific numbers, materials, and configurations have been set forth in order to provide a thorough understanding. Nevertheless, embodiments may be practiced without such specific details. Components having substantially the same functional constructions are denoted by like reference characters, and thus any redundant descriptions may be omitted.

Various techniques have been described as multiple discrete operations to assist in understanding the various embodiments. The order of description should not be construed as to imply that these operations are necessarily order dependent. Indeed, these operations need not be performed in the order of presentation. Operations described may be performed in a different order than the described embodiment. Various additional operations may be performed and/or described operations may be omitted in additional embodiments.

"Substrate" or "target substrate" as used herein generically refers to an object being processed in accordance with the invention. The substrate may include any material portion or structure of a device, particularly a semiconductor or other electronics device, and may, for example, be a base substrate structure, such as a semiconductor wafer, reticle, or a layer on or overlying a base substrate structure such as a thin film. Thus, substrate is not limited to any particular base structure, underlying layer or overlying layer, patterned or un-patterned, but rather, is contemplated to include any such layer or base structure, and any combination of layers and/or base structures. The description may reference particular types of substrates, but this is for illustrative purposes only.

Those skilled in the art will also understand that there can be many variations made to the operations of the techniques explained above while still achieving the same objectives of the invention. Such variations are intended to be covered by the scope of this disclosure. As such, the foregoing descriptions of embodiments of the invention are not intended to be limiting. Rather, any limitations to embodiments of the invention are presented in the following claims.

The invention claimed is:

1. A method of patterning a substrate, the method comprising:
providing a substrate having mandrels positioned on an underlying layer, the mandrels comprised of a first material;
forming first sidewall spacers on exposed sidewalls of the mandrels, the first sidewall spacers comprised of a second material;
forming second sidewall spacers on exposed sidewalls of the first sidewall spacers, the second sidewall spacers comprised of a third material;
forming fill structures that fill open spaces defined between exposed sidewalls of the second sidewall spacers that face each other, the fill structures comprised of a fourth material, wherein top surfaces of the mandrels, the first sidewall spacers, the second sidewall spacers, and the fill structures are all uncovered, and wherein the first material, the second material, the third material and the fourth material are all chemically different from each other;
providing a first etch mask on the substrate that defines openings that uncover the first material, the second material, the third material and the fourth material; and
selectively etching a first-selected material using the first etch mask and first etch chemistry.

2. The method of claim 1, wherein the first material, the second material, the third material and the fourth material are all chemically different from each other in that a first etch chemistry selectively etches the first material relative to remaining materials, a second etch chemistry selectively etches the second material relative to remaining materials, a third etch chemistry selectively etches the third material relative to remaining materials, and a fourth etch chemistry selectively etches the fourth material relative to remaining materials.

3. The method of claim 1, wherein the first material, the second material, the third material and the fourth material are all chemically different from each other in that when etching using a predetermined etch chemistry a given two materials are selectively etched with respect to remaining materials.

4. The method of claim 1, wherein the first material, the second material, the third material and the fourth material are all chemically different from each other in that etching the substrate using a predetermined etch chemistry selectively etches a given three materials with respect to remaining materials.

5. The method of claim 1, wherein two of the first material, the second material, the third material and the fourth material are a same material in that a first etch chemistry simultaneously selectively etches two of the first material, the second material, the third material and the fourth material with respect to remaining materials.

6. The method of claim 1, further comprising executing an etching process using a predetermined etch chemistry that etches one or more selected materials selectively with respect to remaining materials.

7. The method of claim 1, wherein the underlying layer is comprised of a fifth material that is chemically different from the first material, the second material, the third material and the fourth material.

8. The method of claim 1, further comprising:
selectively etching a second selected material using the first etch mask and a second chemistry.

9. The method of claim 1, wherein at least a portion of the first sidewall spacers define open space between each other prior to forming the second sidewall spacers.

10. The method of claim 1, wherein a pitch of the mandrels is less than an optical resolution of a given photolithography system.

11. The method of claim 1, wherein half pitch spacing of the mandrels is less than 16 nanometers.

12. The method of claim 1, wherein forming the second sidewall spacers includes conformally depositing the third material on the substrate and;
executing a spacer open etch that removes the third material from a top surface of the mandrels and from the underlying layer in between the first material deposited on sidewalls of the first sidewall spacers.

13. The method of claim 1, wherein forming the fill structures that fill open spaces defined between exposed sidewalls of the second sidewall spacers includes:
depositing an overburden of the fourth material on the substrate; and
etching back the fourth material until the fourth material is recessed below top surfaces of the second sidewall spacers.

14. a method of patterning a substrate, the method comprising;
providing a substrate having mandrels positioned on an underlying layer, wherein providing the substrate having the mandrels positioned on the underlying layer includes the mandrels being comprised of two materials, a lower portion of the mandrels being comprised of the first material, and an upper portion of the mandrels being comprised of a sixth material, wherein the first material is selected as a stop material layer that is resistant to chemical-mechanical polishing;
forming first sidewall spacers on exposed sidewalls of the mandrels, the first sidewall spacers comprised of a second material;
forming second sidewall spacers on exposed sidewalls of the first sidewall spacers,the second sidewall spacers comprised of a third material; and
forming fill structures that fill open spaces defined between exposed sidewalls of the second sidewall spacers that face each other, the fill structures comprised of a fourth material, wherein top surfaces of the mandrels, the first sidewall spacers, the second sidewall spacers, and the fill structures are all uncovered, and wherein at least two of the first material, the second material, the third material and the fourth material are chemically different from remaining materials.

15. The method of claim 14, further comprising planarizing the substrate by executing a chemical-mechanical polishing process that planarizes the mandrels, the first sidewall spacers, the second sidewall spacers, and the fill structures down to a top surface of the lower portion of the mandrels such that top surfaces of the mandrels, the first sidewall spacers, the second sidewall spacers, and the fill structures are all coplanar.

16. A method of patterning a substrate, the method comprising;
providing a substrate having mandrels positioned on an underlying layer, the mandrels comprised of a first material;
forming first sidewall spacers on exposed sidewalls of the mandrels, the first sidewall spacers comprised of a second material, wherein forming the first sidewall spacers includes conformally depositing the second material on the substrate, and executing a spacer open etch that removes the second material from a top surface of the mandrels and from the underlying layer in between the second material deposited on sidewalls of the mandrels, wherein executing the spacer etch includes etching partially into the underlying layer;

forming second sidewall spacers on exposed sidewalls of the first sidewall spacers, the second sidewall spacers comprised of a third material; and forming fill structures that open spaces defined between exposed sidewalls of the second sidewall spacers that face each other, the fill structures comprised of a fourth material, wherein top surfaces of the mandrels, the first sidewall spacers, the second sidewall spacers, and the fill structures are all uncovered, and wherein at least two of the first material, the second material, the third material and the fourth material are chemically different from remaining materials.

17. A method of patterning a substrate, the method comprising:

providing a substrate having mandrels positioned on an underlying layer, the mandrels comprised of a first material;

forming first sidewall spacers on exposed sidewalls of the mandrels, the first sidewall spacers comprised of a second material;

forming second sidewall spacers on exposed sidewalls of the first sidewall spacers, the second sidewall spacers comprised of a third material;

forming fill structures that fill open spaces defined between exposed sidewalls of the second sidewall spacers that face each other, the fill structures comprised of a fourth material, wherein top surfaces of the mandrels, the first sidewall spacers, the second sidewall spacers, and the fill structures are all uncovered, and wherein at least two materials of the first material, the second material, the third material and the fourth material are chemically different from remaining materials;

providing a first etch mask on the substrate that defines openings that uncover the first material, the second material, the third material and the fourth material; and selectively etching one or more materials relative to remaining materials using the first etching mask and a first etch chemistry.

18. The method of claim 17, further comprising:

removing the first etch mask;

providing a second etch mask on the substrate that defines openings that uncover the first material, the second material, the third material and the fourth material; and selectively etching one or more materials relative to remaining materials using the second etch mask and a second etch chemistry.

19. A patterned structure on a semiconductor substrate, the patterned structure comprising:

a nanofabricated structure on a substrate having lines of four different materials, the lines of four different materials defining a repeating sequence of A-B-C-D-C-B-A in at least a portion of the substrate, a top surface of each line being uncovered, at least two of the lines of four different materials having been created as sidewall spacers using conformal deposition on mandrels followed by directional etching, at least one line is formed as fill structures, wherein the mandrels have a half-pitch spacing of less than 16 nanometers, and wherein the lines of four different materials are chemically different from each other in that one or more materials can be selectively etched with respect to remaining materials.

* * * * *